United States Patent
Mulligan

(10) Patent No.: US 7,109,745 B2
(45) Date of Patent: *Sep. 19, 2006

(54) CONFIGURABLE INTEGRATED CIRCUIT FOR USE IN A MULTI-FUNCTION HANDHELD DEVICE

(75) Inventor: Daniel Mulligan, Austin, TX (US)

(73) Assignee: Sigmatel, Inc., Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/189,308

(22) Filed: Jul. 26, 2005

(65) Prior Publication Data

US 2005/0270060 A1 Dec. 8, 2005

Related U.S. Application Data

(63) Continuation of application No. 10/723,634, filed on Nov. 26, 2003, now Pat. No. 6,998,871.

(60) Provisional application No. 60/429,941, filed on Nov. 29, 2002.

(51) Int. Cl.
*H03K 19/177* (2006.01)

(52) U.S. Cl. .............. 326/37; 326/41; 326/47; 326/82

(58) Field of Classification Search ............ 326/37–41, 326/47, 56–57, 82–83
See application file for complete search history.

(56) References Cited

U.S. PATENT DOCUMENTS 6,580,288 B1* 6/2003 Klapproth ............... 326/38

OTHER PUBLICATIONS

Product Data Sheet, STMP3400 Audio Decoder with USB Interface and Voice Record, Mar. 1, 2001—SigmaTel, Inc.

* cited by examiner

*Primary Examiner*—Anh Q. Tran
(74) *Attorney, Agent, or Firm*—Garlick Harrison & Markison; Timothy W. Markison

(57) ABSTRACT

A configurable integrated circuit includes at least one general purpose input/output (GPIO) interface module, a first functional module, and a second functional module. The GPIO interface module includes a plurality of GPIO cells, wherein each of the GPIO cells is operably coupled to a corresponding pin of the configurable integrated circuit. When the configurable integrated circuit is in a first functional mode, at least one of the GPIO cells is operably coupled to its corresponding pin such that the corresponding pin functions as a digital input pin for the first functional module. When the configurable integrated circuit is in a second functional mode, at least one of the GPIO cells is operably coupled to its corresponding pin such that the corresponding pin functions as a digital output pin for the second functional module.

4 Claims, 7 Drawing Sheets multi-function handheld device 40 integrated circuit 12

GPIO cell 110-118

CONFIGURABLE INTEGRATED CIRCUIT FOR USE IN A MULTI-FUNCTION HANDHELD DEVICE

CROSS REFERENCE TO RELATED PATENTS

This patent application claims priority under 35 USC § 120 to, and is a continuation of, U.S. patent application Ser. No. 10/723,634, filed Nov. 26, 2003 now U.S. Pat. No. 6,998,871 titled "A CONFIGURABLE INTEGRATED CIRCUIT FOR USE IN A MULTI-FUNCTION HANDHELD DEVICE," which is incorporated herein by reference, and which claims priority under 35 USC § 119 to provisionally filed patent application entitled MULTI-FUNCTION HANDHELD DEVICE, having a provisional Ser. No. of 60/429,941, and a filing date of Nov. 29, 2002, which is incorporated herein by reference.

BACKGROUND OF THE INVENTION

1. Technical Field of the Invention

This invention relates generally to portable electronic equipment and more particularly to integrated circuits used within such portable electronic equipment.

2. Description of Related Art

As is known, integrated circuits are used in a wide variety of electronic equipment, including portable, or handheld, devices. Such handheld devices include personal digital assistants (PDA), CD players, MP3 players, DVD players, AM/FM radio, a pager, cellular telephones, computer memory extension (commonly referred to as a thumb drive or USB flash disk), etc. Each of these handheld devices includes one or more integrated circuits to provide the functionality of the device. For example, a thumb drive may include an integrated circuit for interfacing with a computer (e.g., personal computer, laptop, server, workstation, etc.) via one of the ports of the computer (e.g., Universal Serial Bus (USB), parallel port, FireWire, etc.) and at least one other memory integrated circuit (e.g., flash memory). As such, when the thumb drive is coupled to a computer, data can be read from and written to the memory of the thumb drive. Accordingly, a user may store personalized information (e.g., presentations, Internet access account information, etc.) on his/her thumb drive and use any computer to access the information.

As another example, an MP3 player may include multiple integrated circuits to support the storage and playback of digitally formatted audio (e.g., formatted in accordance with the MP3 specification). As is known, one integrated circuit may be used for interfacing with a computer, another integrated circuit for generating a power supply voltage, another for processing the storage and/or playback of the digitally formatted audio data, and still another for rendering the playback of the digitally formatted audio data audible.

As is further known, integrated circuits have enabled the creation of a plethora of handheld devices, however, to be "wired" in today's electronic world, a person needs to posses multiple handheld devices. For example, one may own a cellular telephone for cellular telephone service, a PDA for scheduling, address book, etc., one or more thumb drives for extended memory functionality, an MP3 player for storage and/or playback of digitally recorded music, a radio, etc. Thus, even though a single handheld device may be relatively small, carrying multiple handheld devices on one's person can become quite burdensome.

Further, each manufacturer of such handheld devices typically offers different look and feel (e.g., features, functions, input/output configurations, etc.) of its handheld devices to distinguish itself in the market place. Still further, a manufacturer may offer several versions of a handheld device with varying feature sets to appeal to multiple market groups. Accordingly, such manufacturers require a multitude of integrated circuits to accommodate their various handheld products. From an integrated circuit manufacturer's perspective, they are required to develop multiple integrated circuits for each of their handheld manufacturing clients or, at a minimum, develop client specific integrated circuits for each handheld manufacturing client tat includes multiple features that may or may not be used. As is well known in the integrated circuit field, having to develop multiple versions of essentially the same integrated circuit is costly and substantially impacts profit margins. As is further known, including multiple features on an integrated circuit increases the integrated circuit's pin count, which further adds to the cost of the integrated circuit.

Therefore, a need exists for a configurable integrated circuit that provides multiple functions for use in various handheld devices.

BRIEF SUMMARY OF THE INVENTION

The configurable integrated circuit for use in a multiple function handheld device of the present invention substantially meets these needs and others. In one embodiment, a configurable integrated circuit includes at least one general purpose input/output (GPIO) interface module, a first functional module, and a second functional module. The GPIO interface module includes a plurality of GPIO cells, wherein each of the GPIO cells is operably coupled to a corresponding pin of the configurable integrated circuit. When the configurable integrated circuit is in a first functional mode, at least one of the GPIO cells is operably coupled to its corresponding pin such that the corresponding pin functions as a digital input pin for the first functional module. When the configurable integrated circuit is in a second functional mode, at least one of the GPIO cells is operably coupled to its corresponding pin such that the corresponding pin functions as a digital output pin for the second functional module. With such a configurable integrated circuit, multiple features may be included on one integrated circuit with minimal increase of pin count, which may be used by handheld device manufacturers to produce their varied product lines.

DETAILED DESCRIPTION OF THE INVENTION

Figure 1:
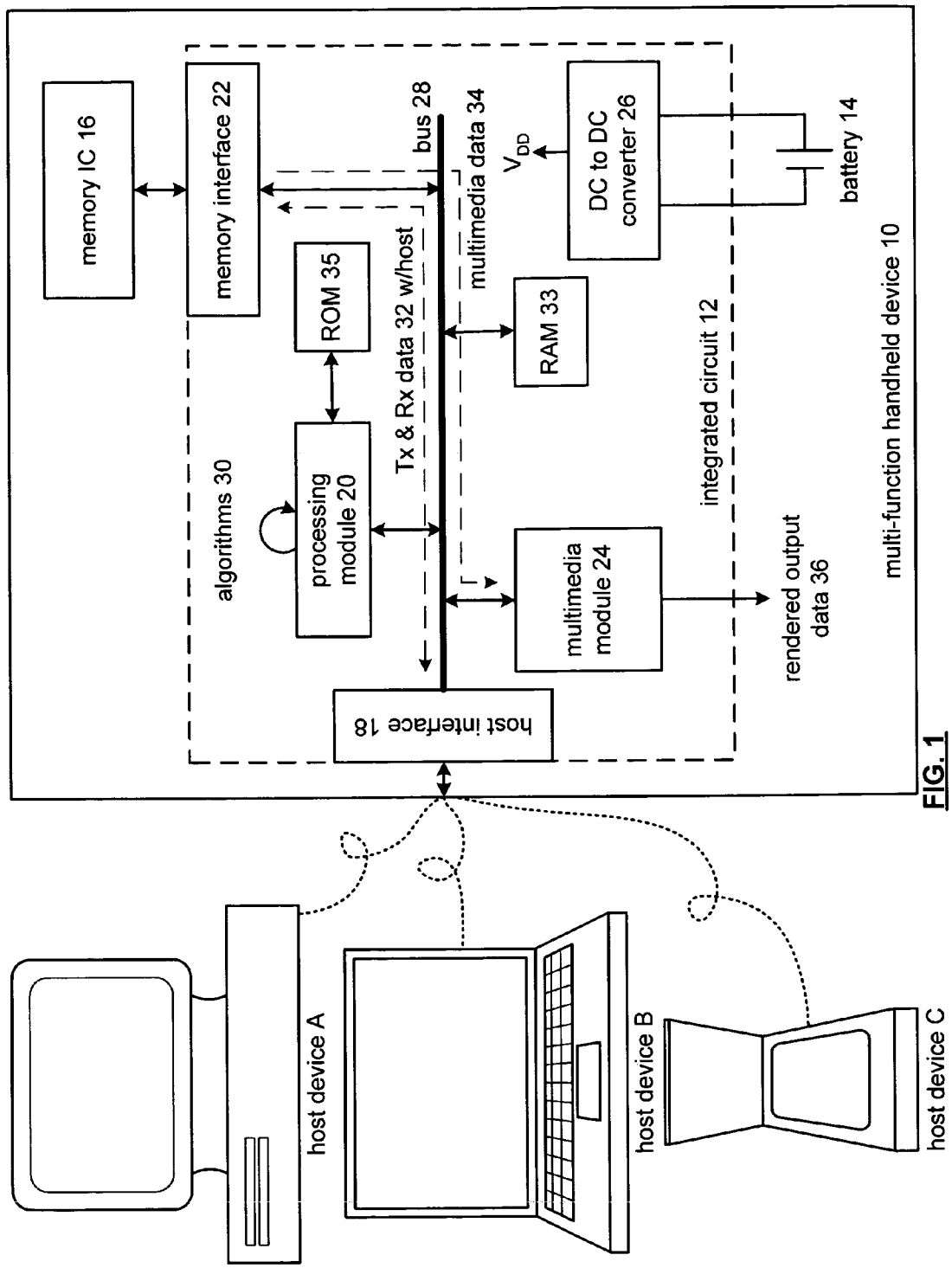
FIG. 1 is a schematic block diagram of a multi-function handheld device in accordance with the present invention.

FIG. 1 is a schematic block diagram of a multi-function handheld device 10 and corresponding integrated circuit 12 operably coupled to a host device A, B, or C. The multi-function handheld device 10 also includes memory integrated circuit (IC) 16 and a battery 14. The integrated circuit 12 includes a host interface 18, a processing module 20, a memory interface 22, a multimedia module 24, a DC-to-DC converter 26, and a bus 28. The multimedia module 24 alone or in combination with the processing module 20 provides the functional circuitry for the integrated circuit 12. The DC-to-DC converter 26, which may be constructed in accordance with the teaching of U.S. Pat. No. 6,204,651, entitled METHOD AND APPARATUS FOR REGULATING A DC VOLTAGE, provides at least a first supply voltage to one or more of the host interface 18, the processing module 20, the multimedia module 24, and the memory interface 22. The DC-to-DC converter 26 may also provide $V_{DD}$ to one or more of the other components of the handheld device 10.

When the multi-function handheld device 10 is operably coupled to a host device A, B, or C, which may be a personal computer, workstation, server (which are represented by host device A), a laptop computer (host device B), a personal digital assistant (host device C), and/or any other device that may transceive data with the multi-function handheld device, the processing module 20 performs at least one algorithm 30, where the corresponding operational instructions of the algorithm 30 are stored in memory 16 and/or in memory incorporated in the processing module 20. The processing module 20 may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The associated memory may be a single memory device or a plurality of memory devices. Such a memory device may be a read-only memory, random access memory, volatile memory, non-volatile memory, static memory, dynamic memory, flash memory, and/or any device that stores digital information. Note that when the processing module 20 implements one or more of its functions via a state machine, analog circuitry, digital circuitry, and/or logic circuitry, the associated memory storing the corresponding operational instructions is embedded with the circuitry comprising the state machine, analog circuitry, digital circuitry, and/or logic circuitry.

With the multi-function handheld device 10 in the first functional mode, the integrated circuit 12 facilitates the transfer of data between the host device A, B, or C and memory 16, which may be non-volatile memory (e.g., flash memory, disk memory, SDRAM) and/or volatile memory (e.g., DRAM). In one embodiment, the memory IC 16 is a NAND flash memory that stores both data and the operational instructions of at least some of the algorithms 30.

In this mode, the processing module 30 retrieves a first set of operational instructions (e.g., a file system algorithm, which is known in the art) from the memory 16 to coordinate the transfer of data. For example, data received from the host device A, B, or C (e.g., Rx data) is first received via the host interface module 18. Depending on the type of coupling between the host device and the handheld device 10, the received data will be formatted in a particular manner. For example, if the handheld device 10 is coupled to the host device via a USB cable, the received data will be in accordance with the format proscribed by the USB specification. The host interface module 18 converts the format of the received data (e.g., USB format) into a desired format by removing overhead data that corresponds to the format of the received data and storing the remaining data as data words. The size of the data words generally corresponds directly to, or a multiple of, the bus width of bus 28 and the word line size (i.e., the size of data stored in a line of memory) of memory 16. Under the control of the processing module 20, the data words are provided, via the memory interface 22, to memory 16 for storage. In this mode, the handheld device 10 is functioning as extended memory of the host device (e.g., like a thumb drive).

In furtherance of the first functional mode, the host device may retrieve data (e.g., Tx data) from memory 16 as if the memory were part of the computer. Accordingly, the host device provides a read command to the handheld device, which is received via the host interface 18. The host interface 18 converts the read request into a generic format and provides the request to the processing module 20. The processing module 20 interprets the read request and coordinates the retrieval of the requested data from memory 16 via the memory interface 22. The retrieved data (e.g., Tx data) is provided to the host interface 18, which converts the format of the retrieved data from the generic format of the handheld device into the format of the coupling between the handheld device and the host device. The host interface 18 then provides the formatted data to the host device via the coupling.

The coupling between the host device and the handheld device may be a wireless connection or a wired connection. For instance, a wireless connection may be in accordance with Bluetooth, IEEE 802.11(a), (b) or (g), and/or any other wireless LAN (local area network) protocol, IrDA, etc. The wired connection may be in accordance with one or more Ethernet protocols, FireWire, USB, etc. Depending on the particular type of connection, the host interface module 18 includes a corresponding encoder and decoder. For example, when the handheld device 10 is coupled to the host device via a USB cable, the host interface module 18 includes a USB encoder and a USB decoder.

As one of average skill in the art will appreciate, the data stored in memory 16, which may have 64 Mbytes or greater of storage capacity, may be text files, presentation files, user profile information for access to varies computer services (e.g., Internet access, email, etc.), digital audio files (e.g., MP3 files, WMA—Windows Media Architecture-, MP3 PRO, Ogg Vorbis, AAC—Advanced Audio Coding, MIDI—Musical Interface), digital video files [e.g., still images or motion video such as MPEG (motion picture expert group) files, JPEG (joint photographic expert group) files, etc.), address book information, and/or any other type of information that may be stored in a digital format. As one of average skill in the art will further appreciate, when the handheld device 10 is coupled to the host device A, B, or C, the host device may power the handheld device 10 such that the battery is unused.

When the handheld device 10 is not coupled to the host device, the processing module 20 executes an algorithm 30 to detect the disconnection and to place the handheld device in a second functional mode. In the second functional mode, the processing module 20 retrieves, and subsequently executes, a second set of operational instructions from memory 16 to support the second functional mode. For example, the second functional mode may correspond to MP3 file playback, digital dictaphone recording, MPEG file playback, JPEG file playback, text messaging display, cellular telephone functionality, and/or AM/FM radio reception. Each of these functions is known in the art, thus no further discussion of the particular implementation of these functions will be provided except to further illustrate the concepts of the present invention.

In the second functional mode, under the control of the processing module 20 executing the second set of operational instructions, the multimedia module 24 retrieves multimedia data 34 from memory 16. The multimedia data 34 includes at least one of digitized audio data, digital video data, and text data. Upon retrieval of the multimedia data, the multimedia module 24 converts the data 34 into rendered output data 36. For example, the multimedia module 24 may convert digitized data into analog signals that are subsequently rendered audible via a speaker or via a headphone jack. In addition, or in the alternative, the multimedia module 24 may render digital video data and/or digital text data into RGB (red-green-blue), YUV, etc., data for display on an LCD (liquid crystal display) monitor, projection CRT, and/or on a plasma type display. The multimedia module 24 will be described in greater detail with reference to FIG. 2.

As one of average skill in the art will appreciate, the handheld device 10 may be packaged similarly to a thumb drive, a cellular telephone, pager (e.g., text messaging), a PDA, an MP3 player, a radio, and/or a digital dictaphone and offer the corresponding functions of multiple ones of the handheld devices (e.g., provide a combination of a thumb drive and MP3 player/recorder, a combination of a thumb drive, MP3 player/recorder, and a radio, a combination of a thumb drive, MP3 player/recorder, and a digital dictaphone, combination of a thumb drive, MP3 player/recorder, radio, digital dictaphone, and cellular telephone, etc.).

Figure 2:
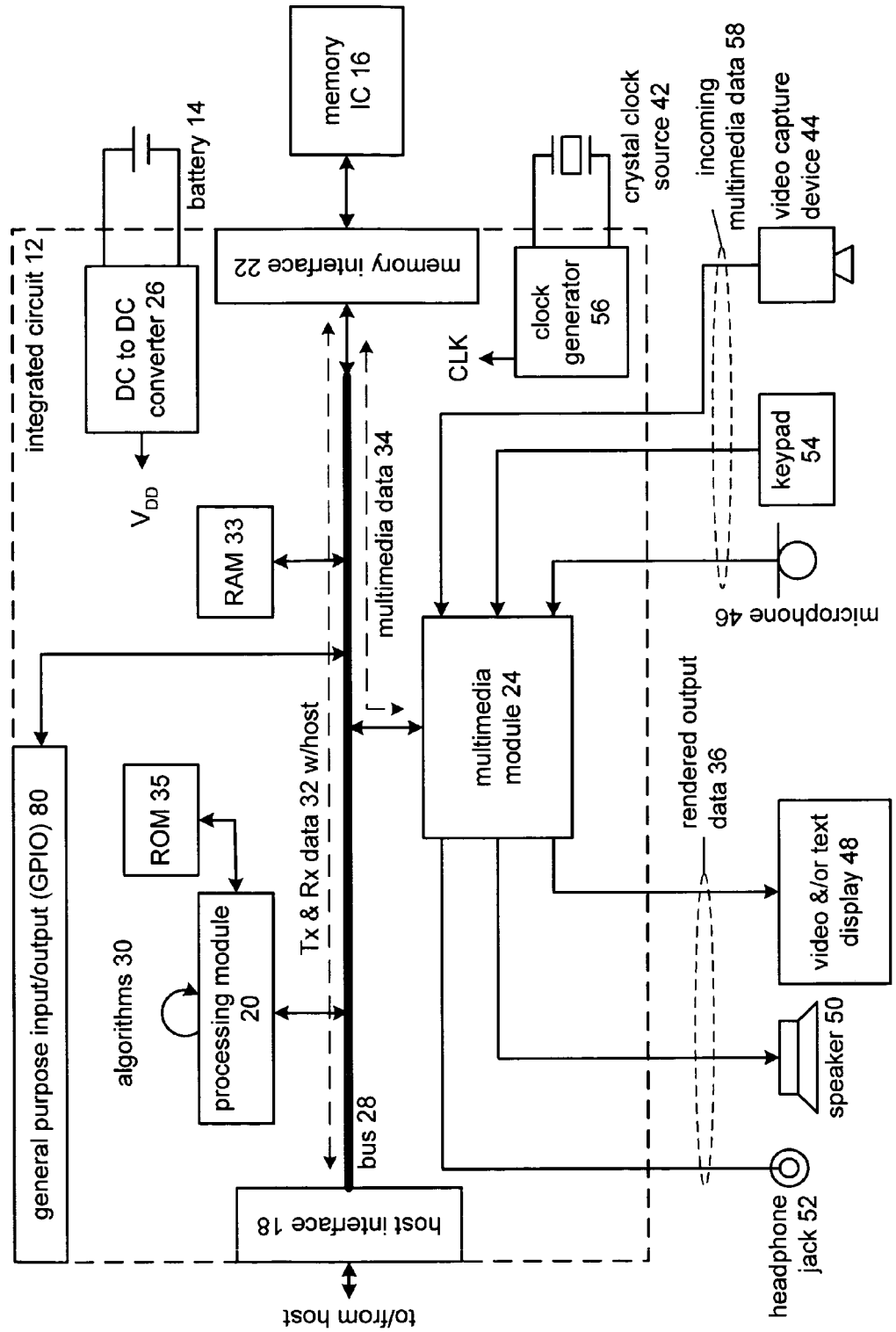
FIG. 2 is a schematic block diagram of another multi-function handheld device in accordance with the present invention.

FIG. 2 is a schematic block diagram of another handheld device 40 and a configurable integrated circuit 12. In this embodiment, the handheld device 40 includes the configurable integrated circuit 12, the battery 14, the memory 16, a crystal clock source 42, one or more multimedia input devices (e.g., one or more video capture device(s) 44, keypad(s) 54, microphone(s) 46, etc.), and one or more multimedia output devices (e.g., one or more video and/or text display(s) 48, speaker(s) 50, headphone jack(s) 52, etc.). The configurable integrated circuit 12 includes the host interface 18, the processing module 20, the memory interface 22, the multimedia module 24, the DC-to-DC converter 26, random access memory (RAM) 33, read only memory (ROM) 35, at least one general purpose input/output (GPIO) interface module 80, and a clock generator 56, which produces a clock signal (CLK) for use by the other modules. As one of average skill in the art will appreciate, the clock signal CLK may include multiple synchronized clock signals at varying rates for the various operations of the multi-function handheld device.

Handheld device 40 functions in a similar manner as handheld device 10 when exchanging data with the host device (i.e., when the handheld device is in the first functional mode). In addition, while in the first functional mode, the handheld device 40 may store digital information received via one of the multimedia input devices (e.g., video capture device 44, microphone 46, and keypad 54). For example, a voice recording received via the microphone 46 may be provided as multimedia input data 58, digitized via the multimedia module 24 and digitally stored in memory 16. Similarly, video recordings may be captured via the video capture device 44 (e.g., a digital camera, a camcorder, VCR output, DVD output, etc.) and processed by the multimedia module 24 for storage as digital video data in memory 16. Further, the key pad 54 (which may be a keyboard, touch screen interface, or other mechanism for inputting text information) provides text data to the multimedia module 24 for storage as digital text data in memory 16. In this extension of the first functional mode, the processing module 20 arbitrates write access to the memory 16 among the various input sources (e.g., the host and the multimedia module).

When the handheld device 40 is in the second functional mode (i.e., not connected to the host), the handheld device may record multimedia data to and/or playback multimedia data from the memory 16. Note that the data provided by the host when the handheld device 40 was in the first functional mode includes the multimedia data. The playback of the multimedia data is similar to the playback described with reference to the handheld device 10 of FIG. 1. In this embodiment, depending on the type of multimedia data 34, the rendered output data 36 may be provided to one or more of the multimedia output devices. For example, rendered audio data may be provided to the headphone jack 52 and/or to the speaker 50, while rendered video and/or text data may be provided to the display 48. The handheld device 40 may also record multimedia data 34 while in the second functional mode. For example, the handheld device 40 may store digital information received via one of the multimedia input devices 44, 46, and 54.

Figure 4:
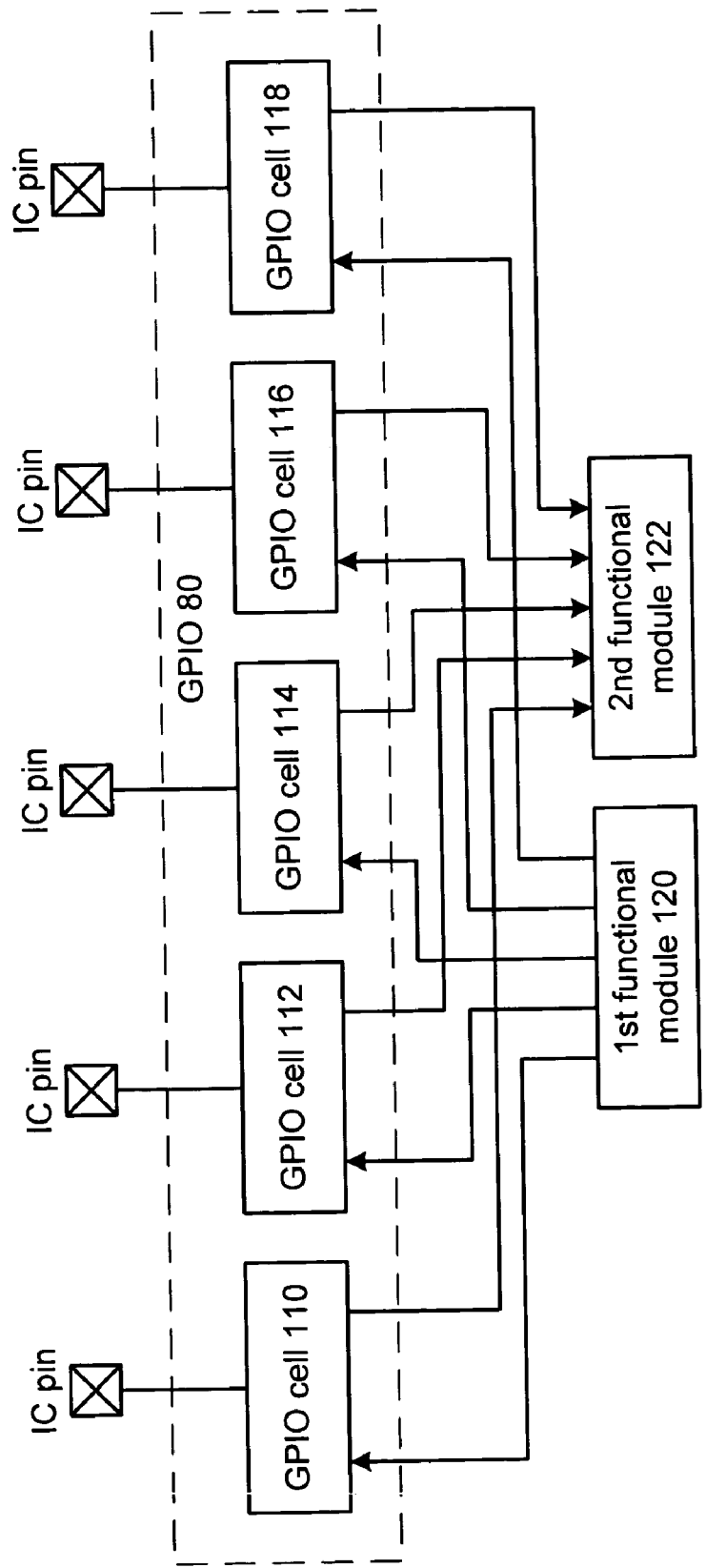
FIG. 4 is a schematic block diagram of a general purpose input/output interface module in accordance with the present invention.
Figure 5:
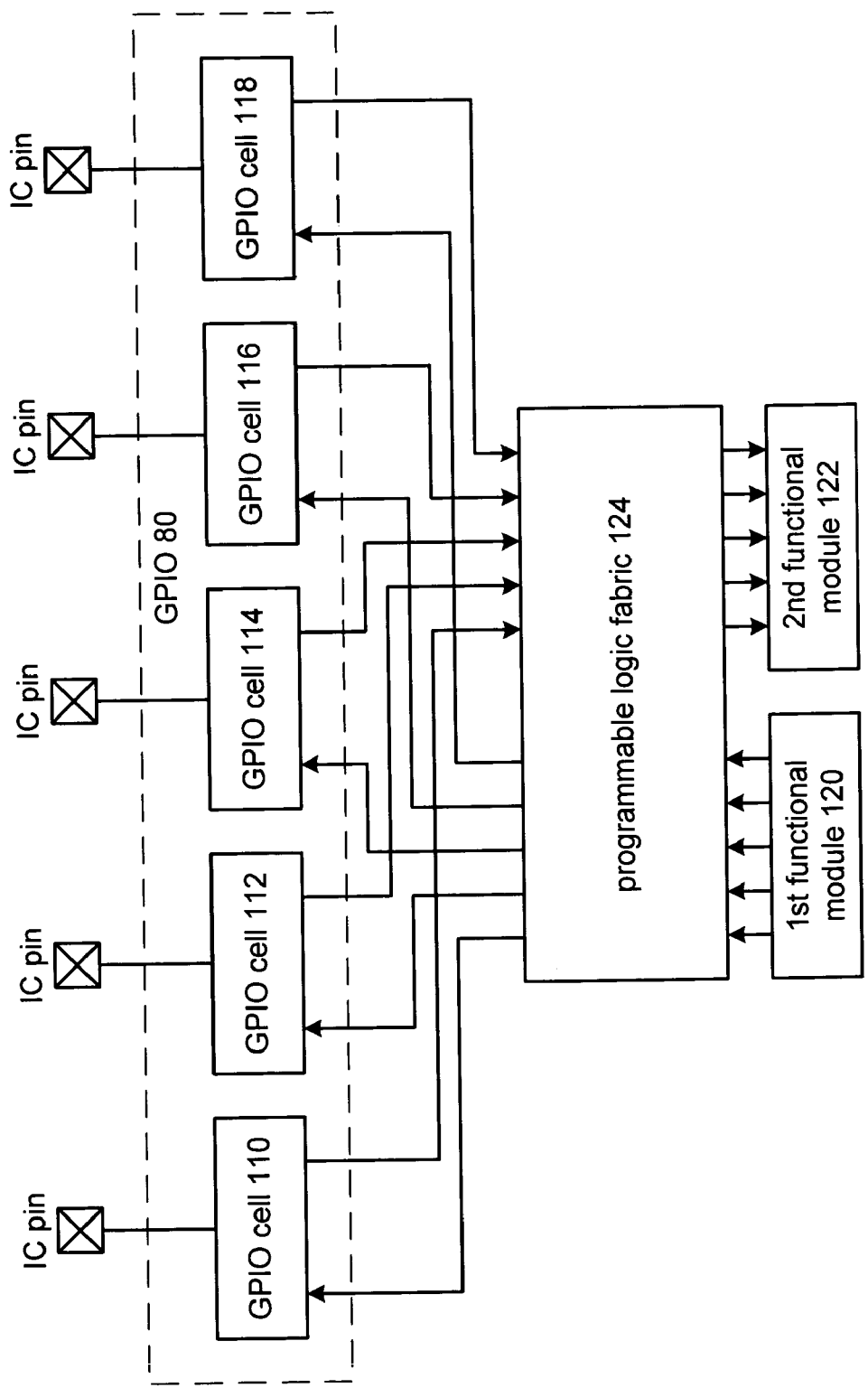
FIG. 5 is a schematic block diagram of another general purpose input/output interface module in accordance with the present invention.
Figure 6:
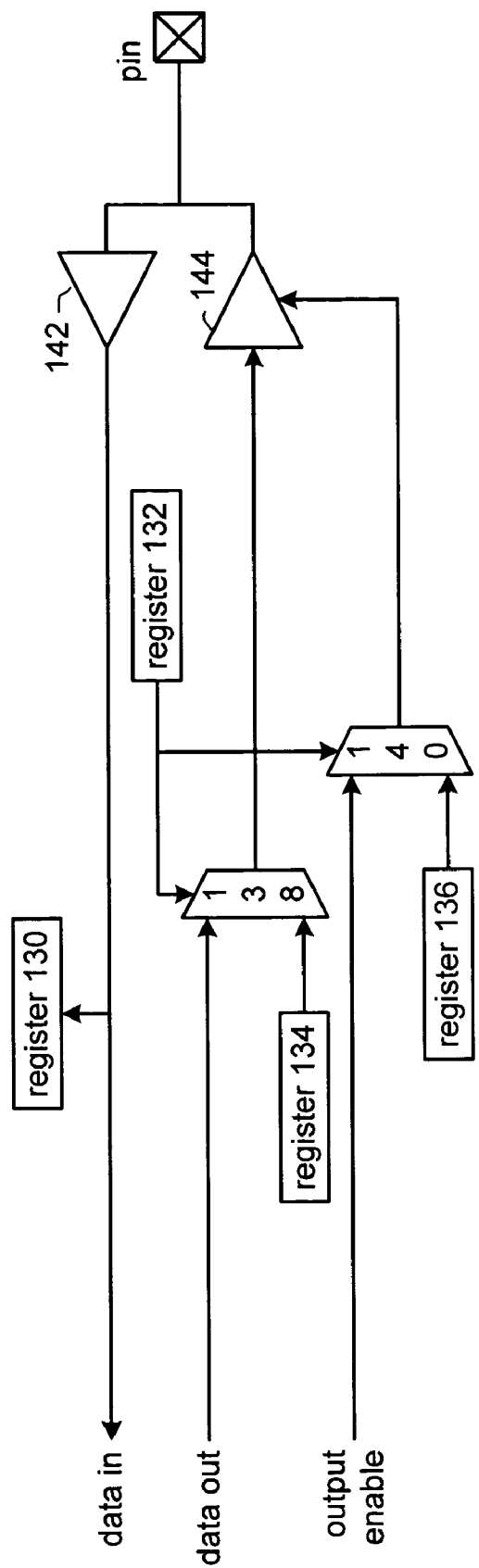
FIG. 6 is a schematic block diagram of a general purpose input/output cell in accordance with the present invention.

The GPIO interface module 80, which will be described in greater detail with reference to FIGS. 4–6, is operably coupled to bus 28 and to one or more peripheral components of the multi-function handheld device 40. For example, the peripheral components include, but are not limited to, a CDROM drive, control buttons, switches, light emitting diode (LED) display, liquid crystal display (LCD) display, MMC/SC card, flash memory module, a RAM memory module, a two-wire interface module, hard drive, and a system packet interface module.

The GPIO interface module 80 may be configured to provide an input and/or an output for one or more of the peripheral components of the multi-function handheld device 40 to functional modules of the integrated circuit 12. The functional modules include the processing module 20, while executing one or more of algorithms 30, one or more of the functions of the multimedia module 24, and/or one or more functions of the host. For example, in one mode, the multi-function handheld device may be reading data from a CD for recording to memory 16 or for playback via the multimedia module 24. In this mode, the GPIO interface module 80 is configured, with respect to its connection to the CDROM drive, to receive digital data, i.e., the corresponding pins are configured as input pins. During the playback or recording of the digital data from the CD, the multi-function handheld device may provide control information (e.g., stop, pause, fast forward, etc.) to the CDROM drive using the same corresponding pins. In this instance, the GPIO module is reconfigured, with respect to its connection to the CDROM drive, to output digital data i.e., the corresponding pins are configured as output pins.

In another example, pins of the integrated circuit 12 coupled to the GPIO interface module 80 may be shared between multiple peripheral devices and/or between multiple functional modules of the integrated circuit 12. For instance, the same pins of the integrated circuit 12 may be used to output digital data to a display (e.g., LCD or LED)

in one mode and, in another mode, be used to receive digital data from buttons and/or switches. As one of average skill in the art will appreciate, there is a wide variety of ways in which the pins of the integrated circuit may be shared via the GPIO interface module 80 to support a multitude of functions provided by the multi-function handheld device.

Figure 3:
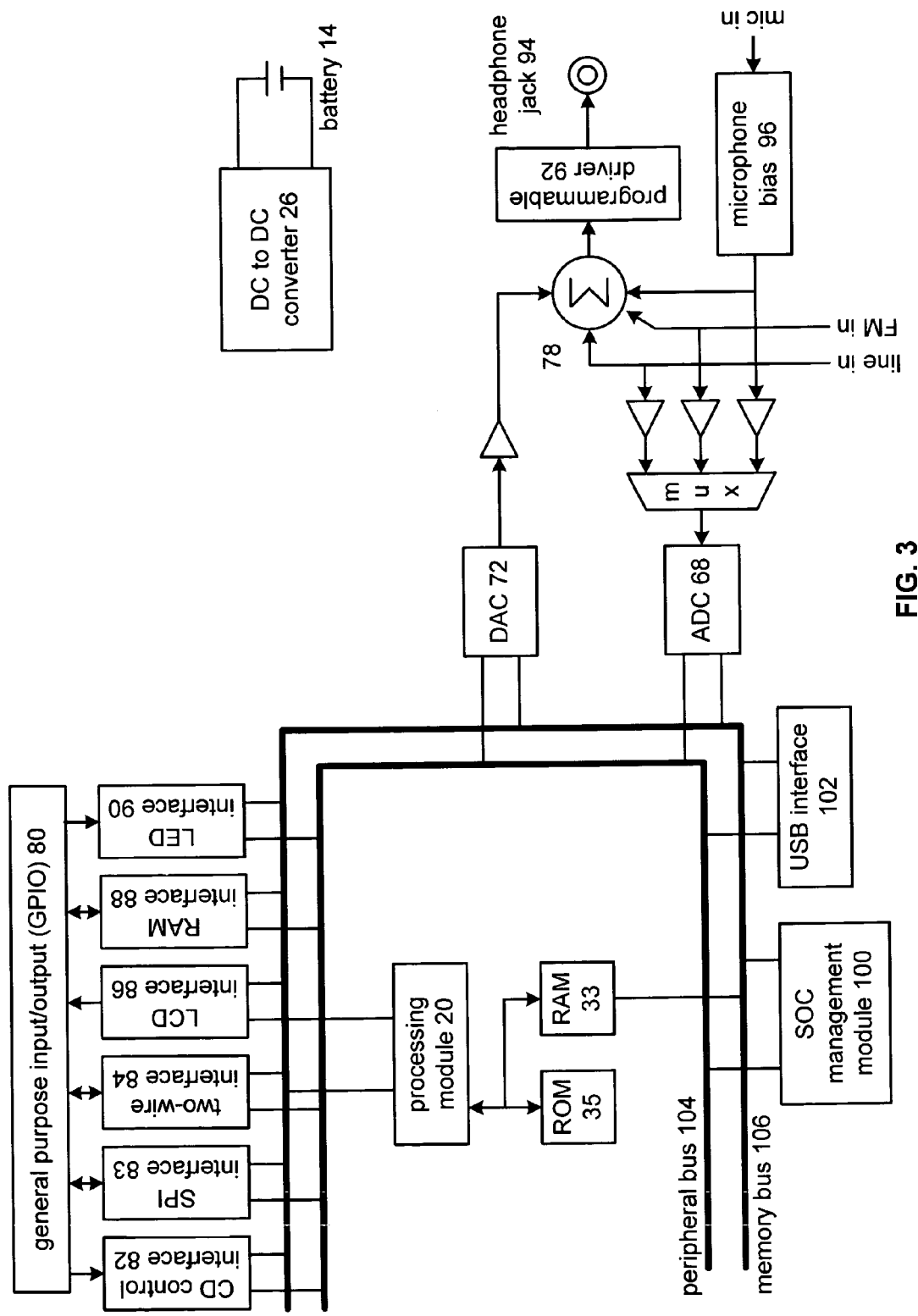
FIG. 3 is a schematic block diagram of a configurable integrated circuit in accordance with the present invention.

FIG. 3 is a schematic block diagram of another embodiment of the integrated circuit 12 that may be incorporated in the multi-function handheld device 10. The integrated circuit 12 includes the GPIO interface module 80, a CD control interface 82, a serial packet interface (SPI) module 83, a two-wire interface module 84, an LCD display interface module 86, a static and/or dynamic RAM interface 88, an LED interface module 90, processing module 20, ROM 35, RAM 33, a peripheral bus 104, a memory bus 106, a system-on-a-chip (SOC) management module 100, a universal serial bus (USB) interface 102, a digital-to-analog converter 72, an analog-to-digital converter 68, a multiplexer, buffers, mixing module 78, DC to DC converter 26, a programmable driver 92, and a microphone bias module 96.

In operation, the integrated circuit 12 may facilitate the transceiving of data with a host device between system memory of a multi-function handheld device and a host device, may playback multimedia data, and/or may record multimedia data via input ports. When the integrated circuit 12 is transceiving with a host device, the USB interface 102 operably couples the integrated circuit 12 to a host device. In addition, the RAM interface 88 couples, either via the general purpose input/output interface module 80 or directly, to the system memory (e.g., memory IC 16) of the multi-function handheld device 10. In this configuration, data that is received from the host device is placed on the memory bus 106 by the USB interface 102. The SDRAM interface 88 retrieves the data from the memory bus 106 and forwards it for storage to the system memory under the control of the processing module 20 that is executing a file system storage algorithm. The data being stored may correspond to playback data, such as an MP3 file, a WMA file, a video file, a text file, and/or a combination thereof. Alternatively, or in addition to, the data being received from the host may correspond to programming instructions of an algorithm 30, which may be an MP3 decoder algorithm, a WMA decoder algorithm, a MPEG algorithm, a JPEG algorithm, et cetera.

For providing data from the handheld device 10 to the host device, the RAM interface 88 retrieves data from the system memory and places it on the memory bus 106 under the control of the processing module 20 as it executes a file system algorithm. The USB interface 102 retrieves the data from the memory bus 106 and forwards it to the host device in accordance with one of the versions of the USB standard.

Data may also be stored in the system memory that is received via the CD (compact disk) control interface 82, and/or via the two-wire interface 84, which may be expanded to a three or four wire interface. Via these interfaces 82 and 84, data is received via the general purpose input/output module 80, which will be described in greater detail with reference to FIGS. 4-8, and placed on the memory bus 106. The RAM interface 88 retrieves the data from the memory bus 106 and provides it to the system memory, which is done under the control of the processing module as it executes a data storage algorithm.

When the integrated circuit 12 is recording audio input signals received via the microphone input, the microphone bias circuit 96 biases the audio input signals for optimal operations and provides them to the mixing module 78 and to the multiplexer (mux) via a buffer. The received audio input signals are converted to digital audio signals via the analog-to-digital converter 68. The digital audio signals may then be stored in system memory (e.g., memory IC 16). Alternatively, the audio input signal may be provided to the summing module 78 and subsequently provided to headphone jack 94 via the programmable driver 92 as a component of a summed analog signal. The summing module 78 may sum one or more of the analog input signals it receives from a line input, an FM radio input, the microphone bias circuit 96, and the analog output of the DAC 72 to produce the summed analog signal.

When the integrated circuit 12 is in a playback mode, digital multimedia data is retrieved from the system memory and provided to the digital-to-analog converter 72. The digital-to-analog converter 72 converts the digital multimedia signals, which may be audio data, video data and/or text data, into analog multimedia signals and provides the analog multimedia signals to mixing module 78. In the playback mode, the mixing module 78 will generally have the other inputs muted, such that its output corresponds directly to the analog multimedia signals provided by the digital-to-analog converter 72.

The programmable driver 92 increases the drive power of the analog multimedia signals (e.g., audio signals when the analog multimedia signals are provided to a headphone) and provides it to the headphone jack 94. As one of average skill in the art will appreciate, a fixed driver may replace the programmable driver 92 to drive the headphone jack 94.

In addition to producing audio outputs during playback mode, the integrated circuit 12 may provide video outputs via the LCD interface 86. The display interface 86 drives an LCD display, which, alternatively, may be an LED display, plasma display and/or any other type of display. The data being displayed may correspond to the multimedia data retrieved from the system memory, and/or may correspond to the commands inputted via the GPIO interface module 80.

The system-on-a-chip (SOC) management module 100 processes interrupt controls, generates clock signals for the integrated circuit 12, performs bit manipulations, performs debugging operations, and executes a Reed-Solomon, or other type of encoding/decoding algorithm to encode and/or decode data.

The DC to DC converter 26 provides at least one supply voltage for the integrated circuit 12-3 and typically provides two supply voltages. For example, the DC to DC converter 26 may produce a 3.3 volts supply and a 1.8 volt supply.

FIG. 4 is a schematic block diagram of an embodiment of the GPIO interface module 80 that includes a plurality of GPIO cells 110–118, which will be described in greater detail with reference to FIG. 6. Each of the GPIO cells 110–118 is coupled to provide digital output signals from a first functional module 120 to its corresponding IC pin and to receive digital input signals from its corresponding pin and provide them to the second functional module 122. As configured, one GPIO cell may be functioning to receive digital input signals for the second functional module 122, while another GPIO cell may be functioning to provide digital output signals from the first functional module 120 to its corresponding pin. In general, the configuration of whether a GPIO cell will function as an input or an output is controlled by the processing module 20 as it executes one of it plurality of algorithms 30. As one of average skill in the art will appreciate, even though the first functional module is shown to provide digital output signals it may also include connections to receive digital input signals from the GPIO 80 and the second functional module may also include connections to provide digital output signals to the GPIO 80.

As one of average skill in the art will further appreciate, the first and second modules 120 and 122 may be algorithms being executed by the processing module 20, operations performed by the multimedia module 24, and/or any of the interfaces 82–90 of FIG. 3.

FIG. 5 is a schematic block diagram of another embodiment of the GPIO interface module 80 that includes programmable logic fabric 124 and the plurality of GPIO cells 110–118, which will be described in greater detail with reference to FIG. 6. Each of the GPIO cells 110–118 is coupled to its corresponding IC pin and to receive digital output signals from the programmable logic fabric and to provide them to its corresponding pin and to provide digital input signals from its corresponding pin to the programmable logic fabric 124. The programmable logic fabric 124, which may be a field programmable gate array (FPGA), programmable logic device, and/or any other programmable logic circuitry, is coupled to the first and second functional modules 120 and 122.

In this embodiment, the programmable logic fabric 124 may be programmed to provide different coupling between the IC pins and the first and second functional modules 120 and 122 to enable a handheld device manufacturer to selectively configure the pin of the integrated circuit 12 to facilitate printed circuit board layout. In addition, the programmable logic fabric 124 may be programmed to process the digital input and output signals prior to providing them to the first and/or second functional modules and/or prior to providing them the corresponding pins. Such processing includes, but is not limited to, encoding the signals in accordance with an encoding protocol (e.g., non-return to zero, multi-level digital encoding, etc.), decoding the signals in accordance with the encoding protocol, encrypting the signals in accordance with an encryption protocol, decrypting the signals in accordance with the encryption protocol, adjusting transmit power levels, amplifying power levels of received signals, forward error correction, and equalization.

FIG. 6 is a schematic block diagram of a GPIO cell 110–118 that is coupled to one pin of the integrated circuit 12. Each of the GPIO cells 110–118 includes a plurality of registers 130-136, a plurality of multiplexers 138 and 140, and a plurality of drivers 142 and 144. Register 132 stores a mode select signal that controls the multiplexers 138 and 140. In a 1st state of the GPIO cell, which may correspond to configuring the pin as an output pin, register 132 stores a digital value that causes the multiplexer 138 to pass output data from the first or second functional module 120 or 122 to driver 144. In addition, register 132 provides the digital value corresponding to the first state of the GPIO cell to multiplexer 140, which causes it to pass an output enable signal, which is produced by the processing module 20 while executing one of its algorithms, to the driver 144. The output enable signal either activates or deactivates the driver 144.

In a $2^{nd}$ state of the GPIO cell, register 132 may store an alternative digital value that causes multiplexer 138 to pass data stored in register 134 to driver 144. The data stored in register 134 may be provided by the processing module 20 while executing the current algorithm or another algorithm. In addition, register 132 provides the alternative digital value to multiplexer 140, which passes the output enable signal to driver 144.

In a $3^{rd}$ state of the GPIO cell, register 132 provides a third digital value to multiplexer 140, which causes it to pass the data stored in register 136 to control the activation or deactivation of the driver 144. The data stored in register 136 may be provided by the processing module 20 which executing one of its algorithms. In addition, register 132 provides the third digital value to multiplexer 138, which causes it to pass the output data from the first or second functional module to driver 144.

In a $4^{th}$ state of the GPIO cell, register 132 may store a fourth digital value that causes multiplexer 138 to pass data stored in register 134 to driver 144. The data stored in register 134 may be provided by the processing module 20 while executing the current algorithm or another algorithm. In addition, register 132 provides the fourth digital value to multiplexer 140, which causes it to pass the data stored in register 136 to control the activation or deactivation of the driver 144. As such, the same pin may be used for outputting multiple signals from different functional modules, thus reducing the number of pins needed for the integrated circuit.

The GPIO cell may be configured to receive digital input signals from its corresponding pin via buffer 142 and to provide the received digital input signals to register 130 and/or to the first or second functional module 120 or 122 (e.g., data in). In this mode, the processing module 20, while it executes an algorithm, controls whether the received digital input signals will be provided to register 130 and/or to the first or second functional modules 120 or 122. In addition, the processing module 20 deactivates the driver 144.

Figure 7:
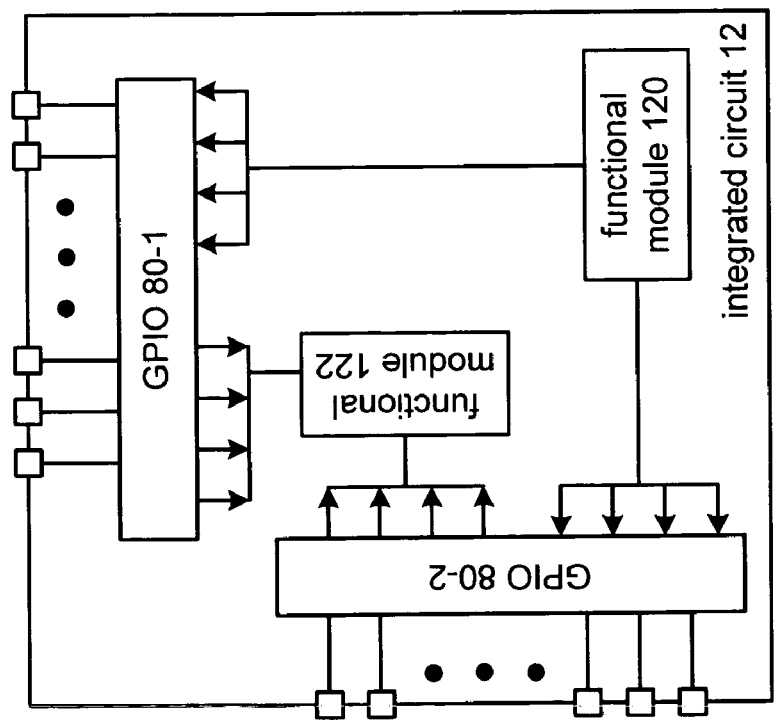
FIG. 7 is a schematic block diagram of another configurable integrated circuit in accordance with the present invention.

FIG. 7 is a schematic block diagram of another embodiment of integrated circuit 12, where the integrated circuit 12 includes a plurality of general purpose input/output (GPIO) modules 80-1 and 80-2. Each GPIO module 80-1 and 80-2 is coupled to the first and second functional modules 120 and 122, respectively. The functional modules 120 and 122 may correspond to the processing module 20, the CD control interface module 82, the I²C interface module 84, display interface module 86, RAM interface module 88, the interface module 90, and/or any other type of data interface that may be used in a handheld multi-function device.

Figure 8:
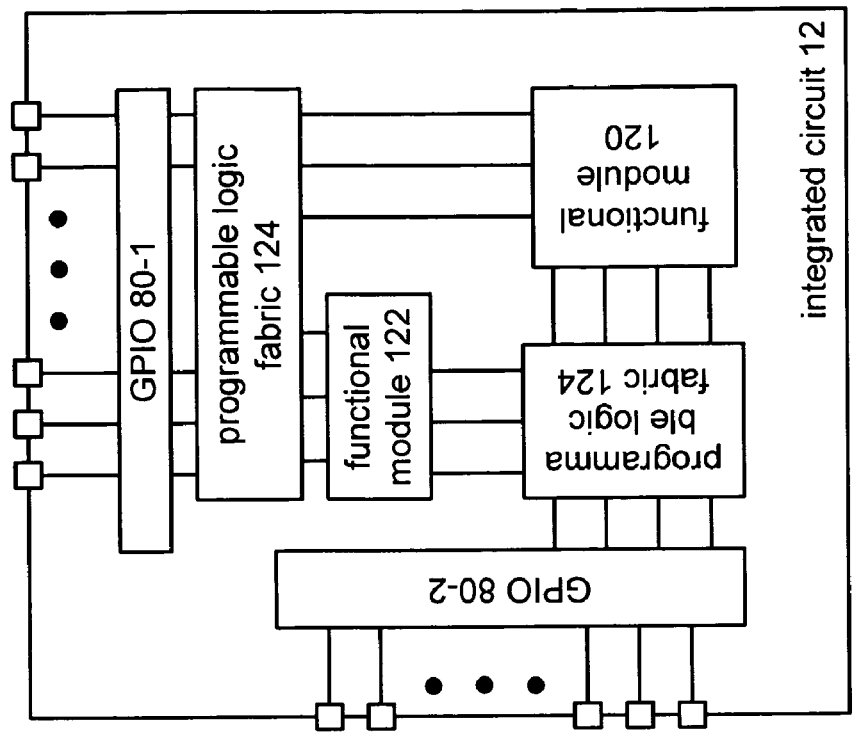
FIG. 8 is a schematic block diagram of yet another configurable integrated circuit in accordance with the present invention.

FIG. 8 is a schematic block diagram of an alternate embodiment of an integrated circuit 12 that includes a plurality of GPIOs 80-1 and 80-2, a plurality of functional modules 120 and 122, and programmable logic fabric 124. The programmable logic fabric may be field programmable gate array circuitry, programmable gate array circuitry and/or any other type of configurable circuitry. As one of average skill in the art will appreciate, the integrated circuit 12 may include more or less GPIO modules, more or less functional modules 120 and 122, and more or less programmable logic fabric 124 than shown in FIG. 8.

As one of average skill in the art will appreciate, the term "substantially" or "approximately", as may be used herein, provides an industry-accepted tolerance to its corresponding term. Such an industry-accepted tolerance ranges from less than one percent to twenty percent and corresponds to, but is not limited to, component values, integrated circuit process variations, temperature variations, rise and fall times, and/or thermal noise. As one of average skill in the art will further appreciate, the term "operably coupled", as may be used herein, includes direct coupling and indirect coupling via another component, element, circuit, or module where, for indirect coupling, the intervening component, element, circuit, or module does not modify the information of a signal but may adjust its current level, voltage level, and/or power level. As one of average skill in the art will also appreciate, inferred coupling (i.e., where one element is coupled to another element by inference) includes direct and indirect coupling between two elements in the same manner as "operably coupled". As one of average skill in the art will further appreciate, the term "compares favorably", as may be used herein, indicates that a comparison between two or more elements, items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

The preceding discussion has presented a configurable integrated circuit for use in a multi-function handheld device. As one of average skill in the art will appreciate, other embodiments may be derived from the teachings of the present invention without deviating from the scope of the claims.

What is claimed is:

1. A multiple function system on a chip integrated circuit comprises:
    a processing module;
    an on-chip read only memory operable to store at least a portion of a boot algorithm, wherein, when initiated, the processing module executes the at least a portion of the boot algorithm;
    an on-chip random access memory operable to store at least a portion of a file transfer algorithm or at least a portion of a playback algorithm, wherein, when initiated, the processing module executes the at least a portion of the file transfer algorithm or the at least a portion of the playback algorithm;
    an external memory interface operable to interface with a memory that stores at least one of a digital audio file and a digital video file;
    a multimedia module operably coupled for at least one of:
        providing an audio output from at least one of the digital audio file and the digital video file;
        providing a video output from the digital video file;
        receiving an audio input; and
        receiving a video input;
    a bus operably coupled to the processing module, the on-chip read only memory, the on-chip random access memory, the external memory interface, and the multimedia module; and
    general purpose input/output (GPIO) module operably coupled to the bus, wherein the GPIO module includes a plurality of GPIO cells, wherein a GPIO cell of the plurality of GPIO cell includes:
        a first register for storing a first input/output control signal;
        a first multiplexer having a first input, a second input, a control input, and an output, wherein the first input of the first multiplexer is operably coupled to receive the first input/output control signal, wherein the second input of the first multiplexer is operably coupled to receive a second input/output control signal, wherein the control input of the first multiplexer receives a mode control signal, wherein, when the mode control signal is in a first state, the first multiplexer outputs the first input/output control signal and, when the mode control signal is in a second state, the first multiplexer outputs the second input/output control signal;
        a second register operably coupled to store a first data out signal;
        a second multiplexer having a first input, a second input, a control input, and an output, wherein the first input of the second multiplexer is operably coupled to receive the first data out signal, wherein the second input of the second multiplexer is operably coupled to receive a second data out signal, wherein the control input of the second multiplexer receives the mode control signal, wherein, when the mode control signal is in the first state, the second multiplexer outputs the first data out signal and, when the mode control signal is in the second state, the second multiplexer outputs the second data out signal;
        an output driver having an input and an output, wherein, when enabled, the output of the output driver is coupled to a pin of the digital media player system on a chip and the input of the output driver is coupled to the output of the second multiplexer; and
        an input driver having an input and an output, wherein the input of the input driver is operably coupled to the pin of the digital media player system on a chip, wherein the output of the first multiplexer indicates whether the output driver is enabled or disabled.

2. The multiple function system on a chip integrated circuit of claim 1 further comprises:
    programmable logic fabric operably coupled between the at least one GPIO module and the bus.

3. The multiple function system on a chip integrated circuit of claim 2 further comprises:
    the plurality of GPIO cells is operably coupled to the programmable logic fabric, wherein the programmable logic fabric is programmed to provide at least one of:
    coupling between at least some of the plurality of GPIO cells and corresponding pins of a set of pins of the multiple function system on a chip integrated circuit;
    processing of inbound digital signals for a first functional mode; and
    processing of outbound digital signals for a second functional mode.

4. The multiple function system on a chip integrated circuit of claim 1 further comprises at least one, of:
    a liquid crystal display (LCD) interface module;
    a light emitting diode (LED) interface module;
    a random access memory (RAM) interface module;
    a compact disk (CD) control interface module;
    flash memory interface module;
    hard drive interface module;
    a two-wire interface module; and
    a system packet interface module.

* * * * *